(12) United States Patent
Bol et al.

(10) Patent No.: US 9,064,842 B2
(45) Date of Patent: Jun. 23, 2015

(54) SEMICONDUCTOR DEVICE INCLUDING GRAPHENE LAYER AND METHOD OF MAKING THE SEMICONDUCTOR DEVICE

(75) Inventors: Ageeth Anke Bol, Yorktown Heights, NY (US); Aaron Daniel Franklin, Croton on Hudson, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 13/425,302

(22) Filed: Mar. 20, 2012

(65) Prior Publication Data

US 2013/0248823 A1 Sep. 26, 2013

(51) Int. Cl.
| | |
|---|---|
| H01L 29/778 | (2006.01) |
| H01L 21/335 | (2006.01) |
| H01L 29/417 | (2006.01) |
| H01L 21/02 | (2006.01) |
| C01B 31/04 | (2006.01) |
| H01L 29/16 | (2006.01) |

(52) U.S. Cl.
CPC .... *H01L 29/41733* (2013.01); *H01L 21/02527* (2013.01); *C01B 31/0469* (2013.01); *Y10S 977/734* (2013.01); *H01L 29/778* (2013.01); *H01L 29/1606* (2013.01)

(58) Field of Classification Search
CPC ............... H01L 2224/48227; H01L 27/0688; H01L 29/1606; H01L 21/02527; G01N 27/4146; Y10S 977/734; C01B 31/0469
USPC ..................... 257/288, 29; 438/151
See application file for complete search history.

(56) References Cited

U.S. PATENT DOCUMENTS

| | | | |
|---|---|---|---|
| 7,432,185 B2 | 10/2008 | Kim et al. | |
| 7,825,472 B2 | 11/2010 | Park et al. | |
| 8,101,980 B2* | 1/2012 | Heo et al. | 257/288 |
| 8,575,665 B2* | 11/2013 | Heo et al. | 257/288 |
| 2005/0212014 A1* | 9/2005 | Horibe et al. | 257/213 |
| 2009/0155578 A1* | 6/2009 | Zhamu et al. | 428/336 |
| 2009/0166686 A1 | 7/2009 | Hunt et al. | |
| 2009/0185407 A1 | 7/2009 | Park et al. | |
| 2009/0283735 A1* | 11/2009 | Li et al. | 257/1 |
| 2009/0321860 A1 | 12/2009 | Klostermann et al. | |
| 2010/0051897 A1* | 3/2010 | Chen et al. | 257/9 |
| 2010/0258787 A1* | 10/2010 | Chae et al. | 257/39 |
| 2010/0279426 A1* | 11/2010 | Tour et al. | 436/149 |
| 2011/0006837 A1* | 1/2011 | Wang et al. | 327/539 |
| 2011/0033746 A1 | 2/2011 | Liu et al. | |
| 2011/0068323 A1 | 3/2011 | Chen et al. | |
| 2011/0101365 A1 | 5/2011 | Kim et al. | |
| 2011/0114918 A1 | 5/2011 | Lin et al. | |
| 2011/0278545 A1* | 11/2011 | Voutilainen et al. | 257/29 |
| 2011/0309336 A1* | 12/2011 | Shin et al. | 257/29 |
| 2012/0074387 A1* | 3/2012 | King | 257/29 |
| 2012/0132885 A1* | 5/2012 | Lippert et al. | 257/9 |
| 2012/0168722 A1* | 7/2012 | Chung et al. | 257/29 |
| 2012/0326126 A1* | 12/2012 | Chen et al. | 257/29 |
| 2013/0082242 A1* | 4/2013 | Han et al. | 257/29 |

* cited by examiner

*Primary Examiner* — Steven J Fulk
(74) *Attorney, Agent, or Firm* — Vazken Alexanian; McGinn IP Law Group, PLLC

(57) ABSTRACT

A semiconductor device includes a substrate, first plural contacts formed in the substrate, a graphene layer formed on the substrate and on the first plural contacts and second plural contacts formed on the graphene layer such that the graphene layer is formed between the first plural contacts and the second plural contacts.

23 Claims, 8 Drawing Sheets

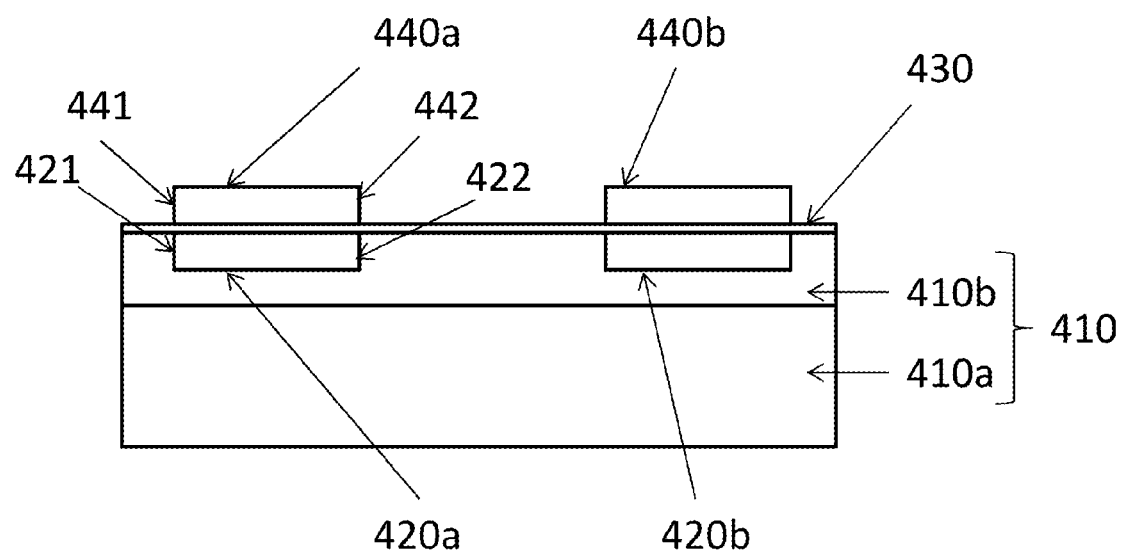
450     Figure 4F

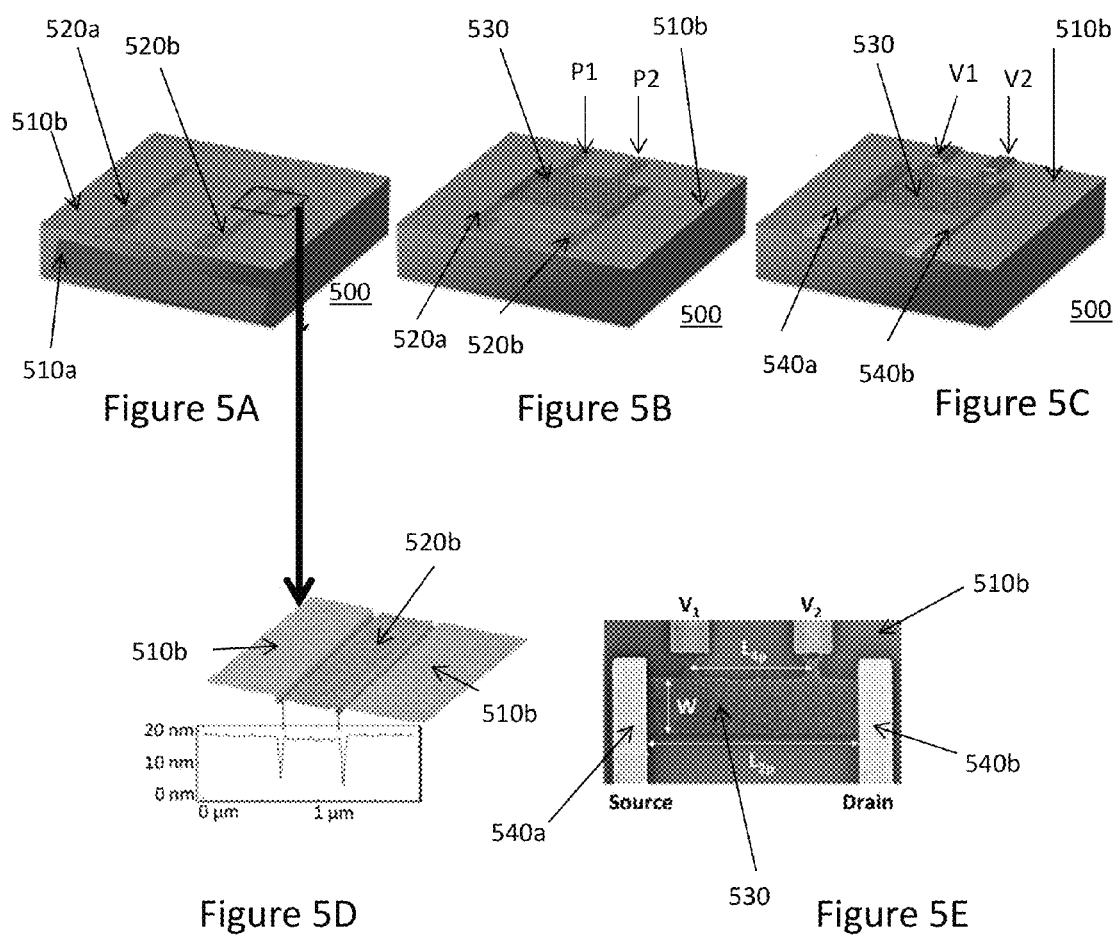

SEMICONDUCTOR DEVICE INCLUDING GRAPHENE LAYER AND METHOD OF MAKING THE SEMICONDUCTOR DEVICE

STATEMENT OF GOVERNMENT INTEREST

This invention was made with Government support under Contract No. FA8650-08-C-7838 awarded by Defense Advanced Research Projects Agency (DARPA). The Government has certain rights in this invention.

BACKGROUND OF THE INVENTION

1. Field of the Invention

The present invention relates generally to a semiconductor device which includes a graphene layer, and more particularly, to a semiconductor device which includes a graphene layer, and first and second plural contacts.

2. Description of the Related Art

Owing to reports of graphene's extremely high intrinsic mobility and unique electronic structure along with demonstrations of device cutoff frequencies in the hundreds-of-gigahertz range, graphene transistors have become of great interest for electronic applications.

FIG. 1 illustrates a related art graphene device (e.g., a graphene transistor and, more particularly, a graphene field effect transistor (FET)) 110.

As illustrated in FIG. 1, the graphene device 110 may include a transistor having a front-gate configuration and including a graphene channel 116 formed on a substrate 105 (e.g., formed on an upper surface of the substrate 105) such as an SiC substrate, a gate dielectric 114 formed on the graphene channel 116 (e.g., formed on an upper surface of the graphene channel 116), source and drain electrodes 118a, 118b formed on the substrate 105 and contacting the graphene channel 116 and the gate dielectric 114 (e.g., contacting a side surface of the graphene channel 116 and a side surface of the gate dielectric 114), and a gate 112 formed on the gate dielectric 114 (e.g., formed on an upper surface of the gate dielectric 114).

In particular, the source and drain electrodes 118a, 118b may include metal contacts which are formed on a surface of a layer of graphene which forms the graphene channel 116.

As the performance of graphene devices has continued to increase, so also has the understanding of transport properties and performance limitations. It has become apparent that controlling the interface between the layer of graphene, and the metal contacts (e.g., the source and drain electrodes 118a, 118b) (i.e., controlling the metal-graphene contact interface) is one of the foremost challenges to maximizing performance in the graphene device 110. A variety of factors, such as metal-induced doping of the graphene in the graphene channel 116, may result in contact resistances that can often dominate the operation of the graphene device 110 (e.g., graphene transistors).

To reduce the contact resistance, various metals have been studied for the metal contacts. In addition, a variety of contact annealing conditions have also been studied.

However, to date, none of the related art approaches has provided a complete solution to meaningfully reducing (e.g., completely minimizing) the role of contact resistance in the performance of the graphene device 110.

SUMMARY OF THE INVENTION

In view of the foregoing and other problems, disadvantages, and drawbacks of the aforementioned conventional systems and methods, an exemplary aspect of the present invention is directed to a semiconductor device including a graphene layer which may have a reduced contact resistance $R_c$ and an improved transconductance as compared to conventional devices.

An exemplary aspect of the present invention is directed to a semiconductor device includes a substrate, first plural contacts formed in the substrate, a graphene layer formed on the substrate and on the first plural contacts and second plural contacts formed on the graphene layer such that the graphene layer is formed between the first plural contacts and the second plural contacts.

Another exemplary aspect of the present invention is directed to a semiconductor device, including a substrate including a pair of trenches, first source and drain contacts formed in the pair of trenches of the substrate, a graphene layer formed on the substrate and on the first source and drain contacts, an upper surface of the first source and drain contacts being substantially co-planar with an upper surface of the substrate, and the graphene layer being formed on the upper surface of the first source and drain contacts and the upper surface of the substrate, and a difference in height (e.g., an abrupt difference in height (e.g. step edge)) between the upper surface of the first source and drain contacts and a height of the upper surface of the substrate being no greater than 5 nm, such that the graphene layer includes an undistorted graphene layer, and second source and drain contacts formed on the graphene layer such that the graphene layer is formed between the first source and drain contacts and the second source and drain contacts, an area of the first source and drain contacts being substantially the same as an area of the second source and drain contacts, and the first source and drain contacts being substantially aligned with the second source and drain contacts to form a double-contact configuration.

Another exemplary aspect of the present invention is directed to a graphene field effect transistor (FET), including a back gate including a doped semiconductor substrate, a gate dielectric including a dielectric layer formed on the doped semiconductor substrate, first source and drain contacts embedded in the dielectric layer, a channel layer including a graphene layer formed on gate dielectric and on the first source and drain contacts, and second source and drain contacts formed on the graphene layer such that the graphene layer is formed between the first source and drain contacts and the second source and drain contacts.

Another exemplary aspect of the present invention is directed to a method of forming a semiconductor device, including forming first plural contacts in a substrate, forming a graphene layer on the substrate and on the first plural contacts, and forming second plural contacts on the graphene layer such that the graphene layer is formed between the first plural contacts and the second plural contacts.

Another exemplary aspect of the present invention is directed to a method of forming a semiconductor device, including: forming first source and drain contacts in a substrate, such that an upper surface of the first source and drain contacts is substantially co-planar with an upper surface of the substrate, and such that a difference in height (e.g., an abrupt difference in height (e.g. step edge)) between the upper surface of the first source and drain contacts and a height of the upper surface of the substrate is no greater than 5 nm, forming a graphene layer on the upper surface of the first source and drain contacts and the upper surface of the substrate such that the graphene layer includes an undistorted graphene layer, and forming second source and drain contacts on the graphene layer such that the graphene layer is formed between the first source and drain contacts and the second source and drain contacts in a double-contact configuration, an area of the first source and drain contacts being substantially the same as an area of the second source and drain contacts, and the first source and drain contacts being substantially aligned with the second source and drain contacts.

With its unique and novel features, the present invention may provide a semiconductor device including a graphene layer having a reduced contact resistance $R_c$ and an improved transconductance as compared to conventional devices.

BRIEF DESCRIPTION OF THE DRAWINGS

The foregoing and other objects, aspects and advantages will be better understood from the following detailed description of the embodiments of the invention with reference to the drawings, in which:

FIG. 4F illustrates the device 450 made by the method 400 of making a semiconductor device, according to an exemplary aspect of the present invention;

FIG. 5A illustrates the first plural contacts 520a, 520b in the device 500, according to an exemplary aspect of the present invention;

FIG. 5B illustrates the graphene layer 530 in the device 500, according to an exemplary aspect of the present invention;

FIG. 5C illustrates the second plural contacts 540a, 540b in the device 500, according to an exemplary aspect of the present invention;

FIG. 5D illustrates a interface between the oxide layer 510b and a contact 520b of the first plural contacts 520a, 520b in the device 500, according to an exemplary aspect of the present invention;

FIG. 5E illustrates a plan view of the device 500, according to an exemplary aspect of the present invention;

Figure 1:
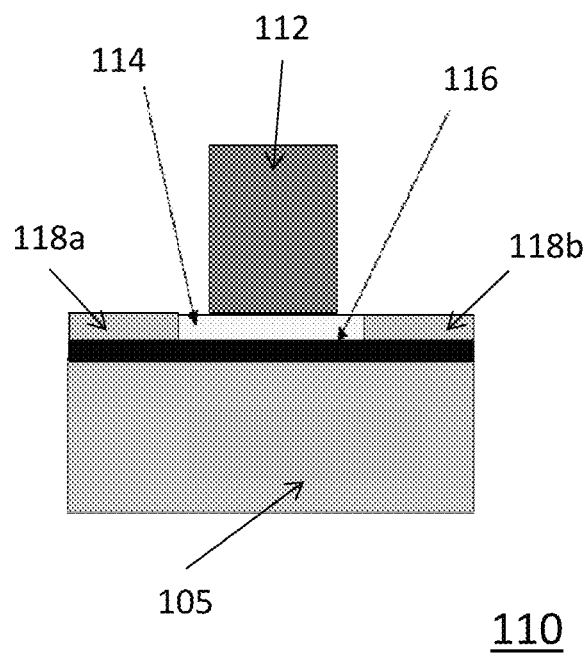
FIG. 1 illustrates a related art graphene device (e.g., a graphene transistor and, more particularly, a graphene field effect transistor (FET)) 110.

DETAILED DESCRIPTION OF THE
EXEMPLARY EMBODIMENTS OF THE
INVENTION

Referring now to the drawings, FIGS. 2-7B illustrate some of the exemplary aspects of the present invention.

Figure 2:
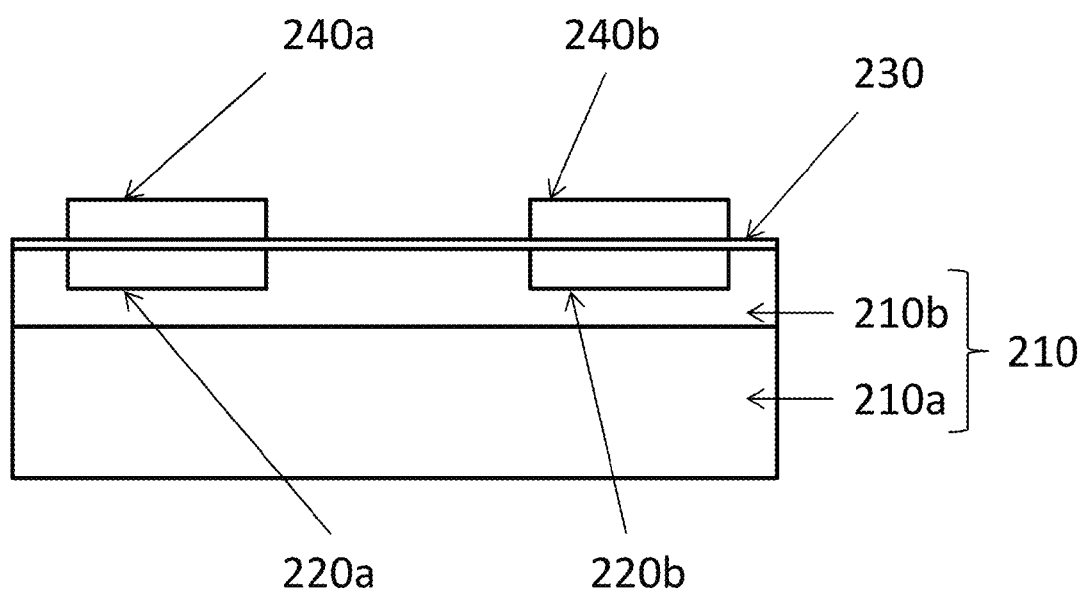
FIG. 2 illustrates a semiconductor device 200 according to an exemplary aspect of the present invention.

In particular, FIG. 2 illustrates a semiconductor device 200 according to an exemplary aspect of the present invention. As illustrated in FIG. 2, the device 200 includes a substrate 210, first plural contacts 220a, 220b formed in the substrate 210, a graphene layer 230 formed on the substrate 210 and on the first plural contacts 220a, 220b, and second plural contacts 240a, 240b formed on the graphene layer such that the graphene layer is formed between the first plural contacts and the second plural contacts.

The semiconductor device 200 may include, for example, a field effect transistor (FET), in which case the first plural contacts 220a, 220b form first source and drain contacts and the second plural contacts 240a, 240b form second source and drain contacts, the substrate 210 may include a doped semiconductor substrate 210a (e.g., p+ Si substrate) which forms a gate (e.g., back gate) of the FET and an oxide layer 210b (e.g., buried oxide) which forms a gate dielectric layer, and the graphene layer forms a channel layer of the FET.

The exemplary aspects of the present invention may provide a novel contact geometry for graphene transistors that provides improved carrier injection at the contacts to lower contact resistance and improve transconductance. The exemplary aspects may involve contacting graphene from below and above in a sandwich-type configuration. Unlike related art devices in which contacts are only on top of the substrate-supported graphene, the exemplary aspects of the present invention may add another half of the contact below the graphene, which may at least effectively double the contact area while maintaining a similar (e.g., the same) device footprint.

A reduction of contact resistance using a double-contact (e.g., sandwich-like) geometry comes primarily from increasing the contact area (e.g., carrier injection) between the contacts (e.g., metal of the contacts) and graphene. Further, because an advantage of the exemplary aspects of the present invention may come from the novel geometry, related art solutions may be applied in parallel with the approach of the exemplary aspects of the present invention for further improvement of the contacts.

Figure 3:
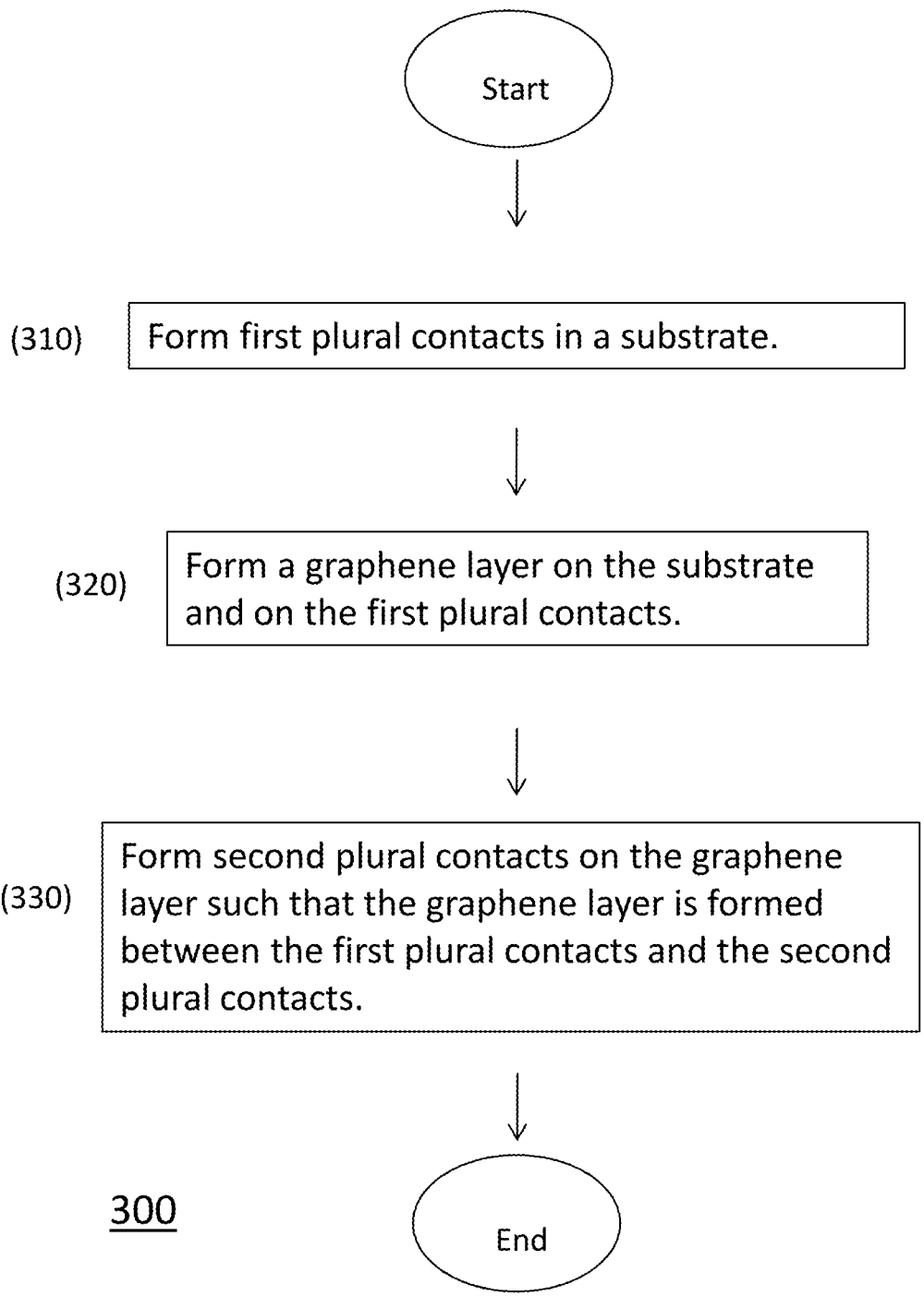
FIG. 3 illustrates a method 300 of forming a semiconductor device, according to an exemplary aspect of the present invention.

FIG. 3 illustrates a method 300 of forming a semiconductor device, according to an exemplary aspect of the present invention.

As illustrated in FIG. 3, the method 300 includes forming 310 first plural contacts in a substrate, forming (320) a graphene layer on the substrate and on the first plural contacts, and forming 330 second plural contacts on the graphene layer such that the graphene layer is formed between the first plural contacts and the second plural contacts.

FIGS. 4A-4D illustrate a flow diagram of a method 400 of making a semiconductor device, according to an exemplary aspect of the present invention.

Figure 4A:
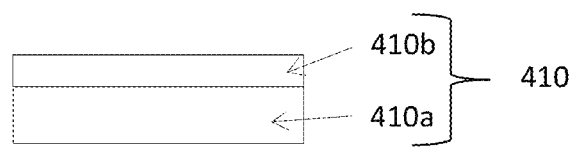
FIG. 4A illustrates forming an oxide layer 410a in the method 400 of making a semiconductor device, according to an exemplary aspect of the present invention.

As illustrated in FIG. 4A, a dielectric layer such as an oxide layer 410b (e.g., an SiO$_2$ layer) is formed on a surface of a semiconductor substrate 410a (e.g., doped silicon substrate such as a p+ silicon substrate) to form the substrate 410. The oxide layer 410b may be formed, for example, by thermal oxidation.

Figure 4B:
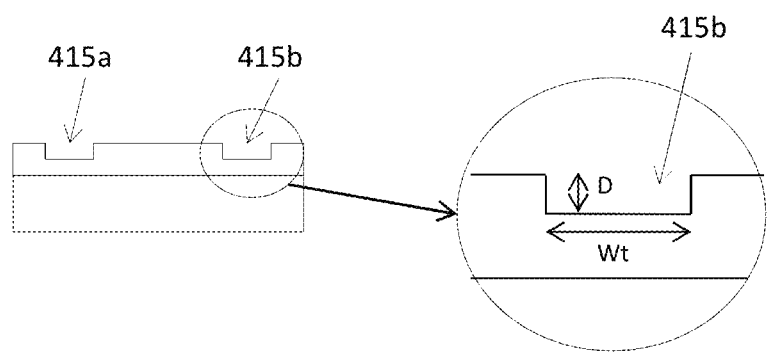
FIG. 4B illustrates forming a trench 415a in the method 400 of making a semiconductor device, according to an exemplary aspect of the present invention.

As illustrated in FIG. 4B, the oxide layer 410b is etched to form plural trenches 315a, 315b in the oxide layer 410b. The plural trenches 415a, 415b may have a depth (D) in a range from about 20 nm to about 300 nm, and a width (W$_t$) in range from about 20 nm to about 1000 nm.

Figure 4C:
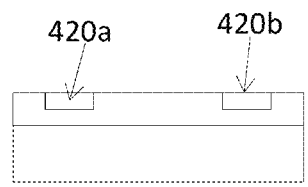
FIG. 4C illustrates forming first plural contacts 420a, 420b in the method 400 of making a semiconductor device, according to an exemplary aspect of the present invention.

As illustrated in FIG. 4C, the first plural contacts 420a, 420b may be formed (e.g., deposited) in the plural trenches 415a, 415b. The first plural contacts 420a, 420b may be formed of a conductive material such as a metal (e.g., gold, nickel, silver, aluminum, copper, palladium, platinum), and may include one or more layers of different conductive materials. For example, in an exemplary aspect of the present invention, the first plural contacts 420a, 420b are formed by forming a titanium layer in the plural trenches 415a, 415b, and forming a palladium layer on the titanium layer in the plural trenches 415a, 415b.

In an exemplary aspect, an upper surface of the first plural contacts 420a, 420b is substantially co-planar with an upper surface of oxide layer 410b. In particular, the first plural contacts 420a, 420b may be formed such that a difference in height (e.g., an abrupt difference in height (e.g., step height)) between the upper surface of the first plural contacts 420a, 420b and a height of the upper surface of the oxide layer 410b is no greater than 5 nm.

Figure 4D:
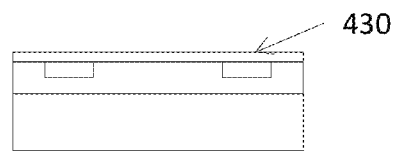
FIG. 4D illustrates forming a graphene layer 430 in the method 400 of making a semiconductor device, according to an exemplary aspect of the present invention.

As illustrated in FIG. 4D, the graphene layer 430 is formed on the first plural contacts 420a, 420b and on the oxide layer 410b. The forming of the graphene layer 430 may include growing single-layer graphene by chemical vapor deposition (CVD) on a copper foil, transferring the grown single-layer graphene onto the substrate 410 and the first plural contacts 420a, 420b, and patterning the single-layer graphene. Alternatively, the forming of the graphene 430 may include mechanically exfoliating bilayer graphene from graphite flakes.

In particular, since the upper surface of the first plural contacts 420a, 420b and the upper surface of the oxide layer 410b are substantially level and even (e.g., a height difference is no greater than about 5 nm) the graphene layer 430 is not distorted at an interface between the oxide layer 410b and the first plural contacts 420a, 420b.

Figure 4E:
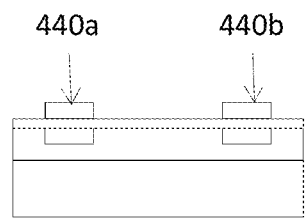
FIG. 4E illustrates forming second plural contacts 440a, 440b in the method 400 of making a semiconductor device, according to an exemplary aspect of the present invention.

As illustrated in FIG. 4E, the second plural contacts 440a, 440b may be formed on the graphene layer 430 and on the first plural contacts 420a, 420b. The second plural contacts 440a, 440b may be formed of a conductive material such as a metal (e.g., gold, nickel, silver, aluminum, copper, palladium, platinum) and may include one or more layers of different conductive materials. For example, in an exemplary aspect of the present invention, the second plural contacts 440a, 440b are formed by forming a titanium layer on the graphene layer 430, forming a palladium layer on the titanium layer, and forming a gold layer on the palladium layer.

The second plural contacts 440a, 440b may be formed of a material which is the same or different than the first plural contacts 420a, 420b, and may be formed of more or less layers than the first plural contacts 420a, 420b, and may have a thickness which is greater than or less than the first plural contacts 420a, 420b.

However, in an exemplary aspect of the present invention, the second plural contacts 440a, 440b are substantially aligned with the first plural contacts 420a, 420b, such that an offset of a contact of the second plural contacts 440a, 440b from a contact of the first plural contacts 420a, 420b is not greater than about 20 nm.

FIG. 4F illustrates a cross-sectional view of the device 450 made by the method 400, according to an exemplary aspect of the present invention. As illustrated in FIG. 4F, the edge 441 of the contact 440a is substantially aligned with the edge 421 of the contact 420a in a horizontal direction, the edge 442 of the contact 440a is substantially aligned with the edge 422 of the contact 420a in a horizontal direction, and so on. In particular, a distance in a horizontal direction between the edge 441 of the contact 440a and the edge 421 of the contact 420a may be no greater than 20 nm, a distance in a horizontal direction between the edge 442 of the contact 440a and the edge 422 of the contact 420a may be no greater than 20 nm, and so on.

In an exemplary aspect semiconductor device 400 may include a field effect transistor (FET). In this case, the doped semiconductor substrate 410a may serve as a backgate for the FET, and the graphene layer 430 may serve as a channel layer for the FET. In addition, the first plural contacts 420a, 420b may serve as first source and drain electrodes, and the second plural contacts 440a, 440b may serve as second source and drain electrodes. That is, the FET may have a double-contact configuration in which the source electrode of the FET includes contacts 420a, 440a and the drain electrode of the FET includes contacts 420b, 440b.

Experimental Results

The inventors conducted experiments which show that for single-layer graphene transistors there was a √2 reduction of contact resistance consistently observed for devices with double contacts versus those with only top contacts. Two types of graphene were studied by the inventors: 1) single-layer graphene that was grown by chemical vapor deposition (CVD) on copper foils and then transferred to the substrate containing bottom contacts, and 2) bilayer graphene that was mechanically exfoliated from graphite flakes. The advantage for CVD-grown films is the large coverage area.

FIGS. 5A-5F illustrate a device 500 according to an exemplary aspect of the present invention. The device 500 includes single-layer graphene and was configured as a graphene transistor. The inventors tested and analyzed the performance of the device 500 (e.g., graphene transistor, by using two test probes that were attached to the device 500 (e.g., contacts V1 and V2 in FIG. 5C).

As illustrated in FIG. 5A, to establish double contacts (e.g., metal below and above the graphene in the source/drain contact area), plural contacts 520a, 520b (e.g., bottom contacts) were first formed in a substrate 510 which includes a doped semiconductor substrate 510a (e.g., p+ silicon substrate) and an oxide layer 510b (e.g., 90 nm SiO$_2$ layer) formed on the doped semiconductor substrate 510a.

Trenches were formed in an oxide layer 510b of the substrate 510 by patterning poly(methyl methacrylate) (PMMA) using e-beam lithography, followed by reactive-ion etching (RIE) the oxide layer 510b (e.g., SiO$_2$) in CF$_4$ to a depth of 20 nm. The PMMA was then undercut by about 10 nm with a 10-second dip in 9:1 buffered oxide etch, followed by the e-beam evaporation and lift-off of the metal layers (e.g., 5-nm Ti/25-nm Pd) which form the plural contacts 520a, 520b.

FIG. 5A illustrates the plural contacts 520a, 520b (e.g., first source and drain contacts) formed in a substrate 510. In particular, FIG. 5A provides a tilted false-colored atomic force microscope (AFM) surface plot of the contacts 520a, 520b (e.g., Pd bottom contacts) embedded in the oxide layer 510b (e.g., 90-nm SiO$_2$).

FIG. 5B illustrates the graphene layer 530 which was transferred onto the contacts 520a, 520b (e.g., bottom contacts). In the device 500, an entire semiconductor chip (e.g., 2 cm×2 cm) chip was covered with the graphene layer 530 (e.g., a CVD-grown, single-layer graphene layer). Such coverage enabled the fabrication of a large set of devices, providing a statistical distribution that could not be similarly obtained using mechanical exfoliation.

The graphene layer 530 was then patterned/etched to include a first portion formed on the contacts 520a, 520b, a second portion (e.g., a channel region) formed between the first portions, and projecting portions P1, P2 for use in testing the device 500 (e.g., graphene transistor). (It should be noted that the projecting portions P1, P2 are only used for testing the device 500 and are not necessarily included in the present invention).

Following the transfer of the graphene layer 530, and patterning (e.g., $O_2$ reactive ion etching (RIE) patterning) of the graphene layer 530, the contacts 540a, 540b (e.g., top contacts) were formed by depositing metal layers (0.5-nm Ti/30-nm Pd/30-nm Au) on the graphene layer 530 and on the contacts 520a, 520b.

A maximum offset between a contact of the contacts 540a, 540b, and a contact of the contacts 520a, 520b in the double-contact configuration was about 20 nm.

FIG. 5C illustrates the device 500 including the contacts 540a, 540b (e.g., top contacts (Pd)) which were formed with the source/drain aligned directly onto the contacts 520a, 520b (e.g., bottom contacts), forming a double-contact geometry (It should be noted that the contacts V1 and V2 are only used for testing the device 500 and are not necessarily included in the present invention).

After the contacts 540a, 540b were formed, the device 500 was annealed in vacuum at 130° C. for 10 hours prior to being electrically tested.

An important feature of the device 500 is that an upper surface of the contacts 520a, 520b is substantially co-planar with an upper surface of the substrate 510, and the graphene layer 530 is formed on the upper surface of the contacts 520a, 520b and the upper surface of the substrate 510. In particular, a difference in height between the upper surface of the contacts 520a, 520b and a height of the upper surface of the substrate 510 is no greater than about 5 nm, which may help to ensure that the graphene layer 530 is not distorted (e.g., an undistorted graphene layer 530).

FIG. 5D provides a higher magnification AFM image showing that a metal surface (e.g., a Pd surface) of the resulting contacts 520a, 520b (e.g., bottom contacts) is nominally flush with a surface of the oxide layer 510b (e.g., the $SiO_2$ layer) to support the graphene layer 530 on a level (e.g., even) surface. In particular, FIG. 5D shows that a difference between a height of a surface (e.g., upper surface) of the contacts 520a, 520b, and a height of a surface (e.g., an upper surface) of the oxide layer 510b (e.g., the $SiO_2$ surface) formed on a side of the contacts 520a, 520b (e.g., surrounding the contacts 520a, 520b) is less than 1 nm.

FIG. 5E provides a scanning electron microscope (SEM) image of a plan view of the device 500, according to an exemplary aspect of the present invention. In particular, FIG. 5E illustrates a completed four-probe structure of the device 500 with relevant dimensions and contacts identified. In the device 500, the width of the graphene layer (W)=1 μm, the distance between projections P1 and P2 is $L_{2p}$=3.5 μm, and the distance between the contacts 540a, 540b ($L_{4p}$)=2 μm.

Note that the p+ Si substrate 510a may be used as a gate (e.g., back gate) for controlling an operation (e.g., gate voltage $V_{gs}$) of the graphene transistor (e.g., controlling a conductance of the channel layer) in the device 500.

Figure 6A:
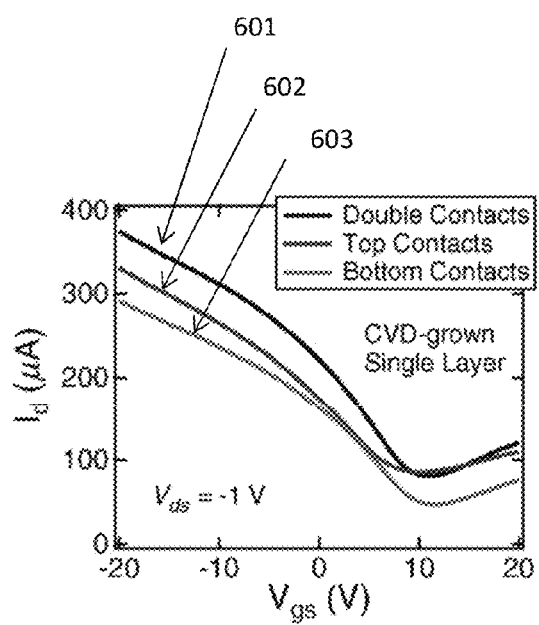
FIG. 6A illustrates test results for a double-contacted device (e.g., device 200) including CVD-grown single-layer graphene, according to an exemplary aspect of the present invention.

FIG. 6A illustrates test results for a double-contacted device (e.g., device 200) including CVD-grown single-layer graphene, according to an exemplary aspect of the present invention. In particular, the FIG. 6A provides a graph which illustrates a comparison of a transfer characteristic (601) of a device according to an exemplary aspect of the claimed invention (e.g., a double-contacted device), with a transfer characteristic (602) of a top-contacted device and a transfer characteristic (603) of a bottom-contacted device.

Figure 6B:
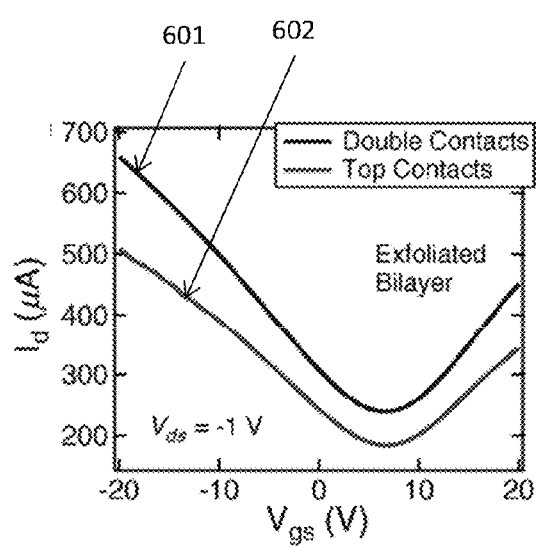
FIG. 6B illustrates test results for a double-contacted device (e.g., device 200) including mechanically exfoliated bilayer graphene, according to an exemplary aspect of the present invention.

FIG. 6B illustrates test results for a double-contacted device (e.g., device 200) including mechanically exfoliated bilayer graphene, according to an exemplary aspect of the present invention. In particular, FIG. 6A provides a graph which illustrates a comparison of a transfer characteristic (601) of a device according to an exemplary aspect of the claimed invention, with a transfer characteristic (602) of a top-contacted device.

As illustrated in FIGS. 6A and 6B, the test results show that improvement in current is seen for both types of graphene (e.g., CVD-grown single-layer graphene (FIG. 6A) and mechanically exfoliated bilayer graphene (FIG. 6B)), in the double-contact geometry of the exemplary aspects of the present invention. However, the improvement is more pronounced in the bilayer case of FIG. 6B. In both cases (FIG. 6A and FIG. 6B), the enhancement in current is greater at high gate bias (far away from the Dirac point). This may be evidence of a decrease in contact resistance, which dominates at gate biases that are far from the neutrality point.

A more thorough analysis is obtained using the additional contacts $V_1$, $V_2$ (e.g., voltage probes) as shown in FIGS. 5C and 5E. Importantly, these contacts V1, V2 (e.g., voltage probes) are external from (or noninvasive to) the graphene layer 530, keeping the contacts V1, V2 from perturbing transport in the graphene layer 530 (e.g., channel) by induced doping.

A very useful aspect of the four-probe structure (e.g., device 500) is a clean extraction of the contact resistance (Rc) as follows:

$$R_c = 1/2(R_{2p} - R_{4p}(L_{2p}/L_{4p}))W,$$

where $R_{2p}$ is the resistance between the source and drain contacts, $R_{4p}$ is the resistance between the contacts V1, V2 (e.g., voltage probes ($V_1$ and $V_2$)), and $L_{2p}$, $L_{4p}$, and W are the dimensions defined in FIG. 5E.

Figure 7A:
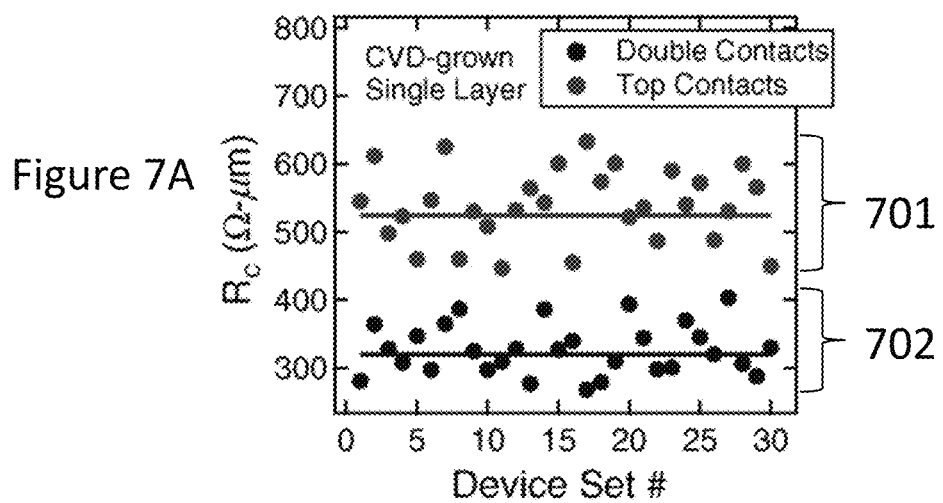
FIG. 7A provides a graph illustrating a contact resistance distribution from a plurality of test sets including single-layer graphene devices tested by the inventors.

FIG. 7A provides a graph illustrating a contact resistance distribution from a plurality of test sets including single-layer graphene devices tested by the inventors. The graph includes a plot of contact resistances (Rc) 701 for the devices (e.g., double-contacted devices) according to an exemplary aspect of the present invention, and a plot of contact resistances (Rc) 702 for the top-contacted devices.

In FIG. 7A, contact resistance ($R_c$) was taken at $V_{gs} - V_{Dirac}$=−20 V. In spite of significant variation, the double-contacted devices (e.g., device 500) consistently exhibited lower $R_c$ than the devices with only top contacts. The lowest $R_c$'s for each geometry are 450Ω·μm for the top contacts and 260Ω·μm for the double contacts. The horizontal lines indicate the average value.

Figure 7B:
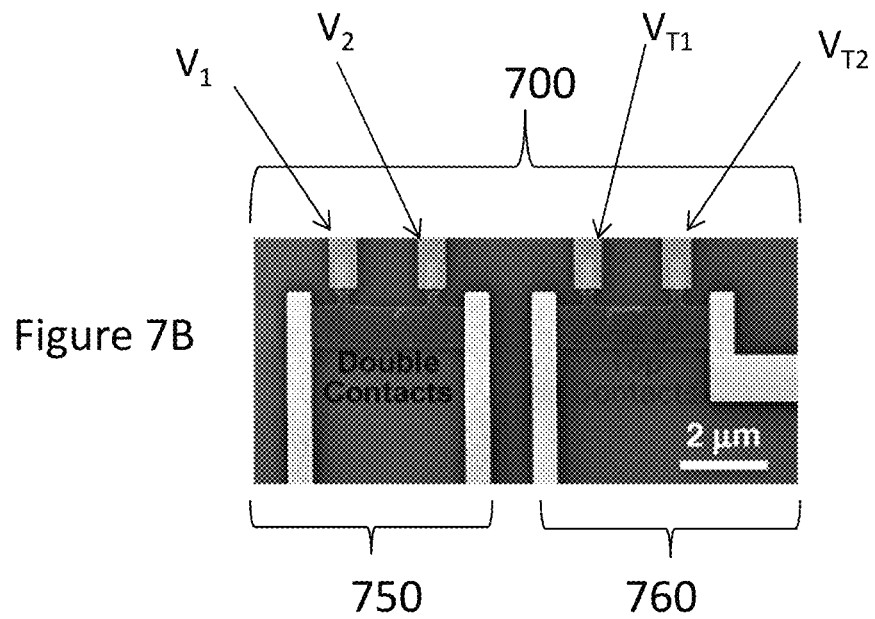
FIG. 7B illustrates an SEM image of a test set 750, with a device 750 according to an exemplary aspect of the present invention (e.g., a double-contacted device) on the left side of the set 700, and the top-contacted device 760 on the right side of the set 700.

FIG. 7B illustrates an SEM image of a test set 750, with a device 750 according to an exemplary aspect of the present invention (e.g., a double-contacted device) on the left side of the set 700, and the top-contacted device 760 on the right side of the set 700.

Discussion of Experimental Results

When working with graphene (particularly CVD grown graphene), there can be a considerable amount of variation in the cleanliness and/or quality of the graphene surface after undergoing transfer. The four-probe structure which was tested by the inventors considers the resistance of each device's graphene channel to extract the resistance at its contacts, thus allowing for a fair comparison of $R_c$ for different devices.

In the study conducted by the inventors, thirty (30) test sets of single-layer graphene devices according to the exemplary aspect of the present invention were tested, with each test set having side-by-side graphene transistors—one transistor 750 with double contacts according to an exemplary aspect of the present invention, and one transistor 760 with only top contacts for the source and drain—as illustrated in FIG. 7B.

Also studied was a set of twelve (12) bottom-contacted devices that were also on single-layer graphene. All voltage probes (e.g., $V_1$ and $V_2$ in transistor 750, and $V_{T1}$ and $V_{T2}$ in transistor 760) were top contacts because the resistance of top contacts does not affect their sole purpose of monitoring voltage.

The distribution of contact resistance $R_c$ for the double-contacted devices 750 and top-contacted devices 760 in the test sets in FIG. 7A, clearly illustrates why having a large sample set is essential for drawing conclusions about the quality of a certain contact geometry. Just as the quality of the graphene channel can vary across a semiconductor chip, so also can the condition of the graphene that interfaces with the contact metal (local defects, residual resist, etc.). Therefore, a sizeable amount of variation in $R_c$ is observed, even when fabricating transistors with the same geometry and in very close proximity on a semiconductor chip.

Despite this sizeable variation in $R_c$, the plot in FIG. 7A reveals that the double-contacted graphene transistors 750 in the test set 700 consistently exhibited lower $R_c$ than their top-contacted transistors 760 in the test set 700.

A summary of some key performance metrics comparing the double-contacted devices according to the exemplary aspects of the present invention, with bottom-contacted devices and top-contacted devices is given below in Table I. In Table 1, contact resistance $R_c$ was taken at $V_{gs}-V_{pirac}=-20V$, where $V_{Dirac}$ is the voltage at the Dirac point.

TABLE I

AVERAGED VALUES OF KEY METRICS FROM ALL DEVICE SETS OF TOP-CONTACTED, BOTTOM-CONTACTED, AND DOUBLE-CONTACTED GRAPHENE TRANSISTORS

| Graphene/Layers | Contact | $R_c$ (Ω·μm) | $g_m$ (μS) | $\mu_{peak}$ (cm²/V$_s$) |
|---|---|---|---|---|
| CVD/Single | Double | 320 | 21 | 1910 |
| CVD/Single | Top | 525 | 16 | 1460 |
| CVD/Single | Bottom | 715 | 18 | 1540 |
| Exfoliated/Bilayer | Double | 250 | 35 | 3190 |
| Exfoliated/Bilayer | Top | 580 | 29 | 2640 |

Compared to the single-layer graphene devices, the exfoliated bilayer devices were much harder to come by because they relied on random placement of the graphene onto pre-defined bottom contacts. Thus, while the inventors tested thirty (30) test sets 700 including the double-contacted devices 750 and top-contacted devices 760 (and twelve (12) bottom-contacted devices) with single-layer graphene, the inventors tested six (6) test sets including the exfoliated bilayer devices. The data from the testing of the exfoliated bilayer devices is included above in Table 1.

As illustrated in Table 1, there is a nearly 40% drop in contact resistance $R_c$ going from top-contacted single-layer devices to double-contacted single-layer devices, which averaged 320Ω·μm with a low of 260Ω·μm, which, to the inventors' knowledge, is the lowest reported contact resistance $R_c$ for a CVD-grown single graphene layer, with previous reports (from various graphene sources) falling in the 500Ω·μm to 1000Ω·μm range.

As further illustrated in Table 1, the bilayer double-contacted devices reached an even lower average $R_c$ of 250Ω·μm, with a low of 180Ω·μm. In addition, there was an improvement in average peak transconductance $g_m$ (and, correspondingly, the peak field-effect mobility $\mu_{peak}$) of 31% for the single layer graphene devices, and an improvement in average peak transconductance $g_m$ (and, correspondingly, the peak field-effect mobility $\mu_{peak}$) of 21% in the and bilayer graphene devices, respectively.

The reason for $g_m$ and $\mu_{peak}$ improving less than $R_c$ is that improvement of the contacts is more clearly observed when the graphene layer is biased far from the Dirac point ($V_{Dirac}$) (e.g., when the device is in the ON state). It is when $V_{gs}$ is swept closer to the Dirac point ($V_{Dirac}$) that the resistance in the graphene channel dominates and more dramatic modulation of the current takes place to yield the peak $g_m$ value (thus $\mu_{peak}$), as seen in the characteristics in FIG. 2. Take, for instance, the higher average mobility observed in the bottom-contacted devices compared to the top-contacted ones, even though the contact resistance is higher.

While the bottom-contacted devices are not on the same graphene channels as the double-contacted devices, the average $R_c$ from the different device sets does provide insight into the improved performance. Unlike in the top-contacted device, the substrate gate does not influence the doping level of the graphene in the source/drain areas for the bottom-contacted device. Therefore, the 36% higher contact resistance $R_c$ in bottom-contacted devices can be attributed to the lower doping level.

Using an electrostatic model with an effective graphene-metal distance d=1 Å and $W_{Pd}-W_G-\Delta c=200$ meV, where $W_{pd}$ and $W_G$ are the palladium and graphene work functions, respectively, and Ac is a correction coefficient due to the correlations, the observed differences in $R_c$ can be better understood. For double-contacted graphene devices according to an exemplary aspects of the present invention (e.g., transistor 750), this model (e.g., for gate capacitance $C_g=\epsilon_0/d$ (where $\epsilon_0$ is the electric constant, and d is the thickness of the dielectric layer (e.g., graphene layer), and gate voltage $V_{gs}=0$) predicts a 23% lower doping level than that in the top-contacted device (e.g., transistor 760).

Taking into account that an increase in graphene-metal coupling by a factor of two (2) would translate to a √2 reduction in contact resistance $R_c$ in a diffusive contact, one would expect a contact resistance of 460Ω·μm in double-contacted devices. This is 40% greater than the measured resistance of 320Ω·μm. This remaining difference may be attributed to a greater metal-induced doping in double-contacted graphene than in the one-sided contact geometries (e.g., top-contact only geometry, and bottom-contact only geometry) owing to the increased coverage of the metal on the graphene (e.g., see FIG. 2, where the graphene layer 230 is contacted by the first plural contacts 220a, 220b and the second plural contacts 240a, 240b).

In the case where bilayer exfoliated graphene is used in the device (e.g., device 750) according to an exemplary aspect of the present invention, the reduction of contact resistance $R_c$ by approximately a factor of two (2) is expected in electrically decoupled layers (e.g., misoriented layers) since carrier injection takes place for each layer independently. However, analysis of an AB stacked bilayer graphene is more complicated than analysis single-layer graphene due to the uncertainty in the ratio of transfer length and an electrical coupling between the layers of the bilayer graphene, which determines an overall contact resistance $R_c$ reduction in the range of $\sqrt{2}$ to 2.

Ultimately, the double-contacted bilayer graphene creates a carrier transport scenario that warrants its own complete study of transport physics.

In conclusion, the inventors have demonstrated that a double-contact geometry (e.g., a metal contact below the graphene layer, and a metal contact above the graphene layer at the source and drain in a graphene FET) may provide improved performance compared to conventional devices which have only top contacts. The results of experiments conducted by the inventors (e.g., testing of dozens of double-contacted and top-contacted four-probe structures) show a consistent reduction of contact resistance $R_c$ between the contacts and the graphene layer, and an improvement of transconductance in the device according to the exemplary aspects of the present invention, as compared to conventional device. On average, in the tests conducted by the inventors, contact resistance $R_c$ dropped from $525\Omega\cdot\mu m$ to $320\Omega\cdot\mu m$ where the graphene layer (e.g., graphene layer 230 in FIG. 2) was single-layer graphene. The inventors attribute the observed improvement in contact resistance $R_c$ to both an enhancement of the effective graphene-metal coupling and a higher graphene doping in the presence of the second metal layer.

With its unique and novel features, the present invention may provide a semiconductor device including a graphene layer having a reduced contact resistance $R_c$ and an improved transconductance as compared to conventional devices.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device, comprising:
    a semiconductor substrate;
    a dielectric layer formed in the semiconductor substrate;
    first plural contacts formed in the dielectric layer such that the dielectric layer comprises:
        a first portion which is formed between the first plural contacts; and
        a second portion which is formed between the semiconductor substrate and the first plural contacts;
    a graphene layer formed on an upper surface of the first portion of the dielectric layer and on an upper surface of the first plural contacts; and
    second plural contacts formed on the graphene layer such that the graphene layer is formed between the first plural contacts and the second plural contacts,
    wherein an area of contact of the first plural contacts is substantially the same as an area of contact of the second plural contacts, and the first plural contacts are substantially aligned with the second plural contacts to form a double-contact configuration, and
    wherein the upper surface of the first plural contacts is substantially co-planar with the upper surface of the first portion of the dielectric layer, such that the graphene layer comprises an undistorted graphene layer.

2. The semiconductor device of claim 1, wherein the dielectric layer comprises plural trenches, and the first plural contacts are formed in the plural trenches, respectively.

3. The semiconductor device of claim 1, wherein the first plural contacts comprise a titanium layer, and a palladium layer formed on the titanium layer.

4. The semiconductor device of claim 1, wherein the graphene layer comprises one of a single-layer of graphene that was grown by chemical vapor deposition (CVD), and bilayer graphene that was mechanically exfoliated from graphite flakes.

5. The semiconductor device of claim 1, wherein the second plural contacts comprise a titanium layer formed on the graphene layer, a palladium layer formed on the titanium layer, and a gold layer formed on the palladium layer.

6. The semiconductor device of claim 1, wherein an offset of a contact of the second plural contacts from a contact of the first plural contacts is not greater than 20 nm.

7. The semiconductor device of claim 1, wherein a contact resistance of the first plural contacts and the second plural contacts is less than $450\Omega\cdot\mu m$.

8. The semiconductor device of claim 1, wherein the semiconductor substrate comprises a p+Si substrate, and the dielectric layer comprises a layer of $SiO_2$ formed on the p+Si substrate, and the first plural contacts are embedded in the layer of $SiO_2$.

9. The semiconductor device of claim 8, wherein the semiconductor device comprises a field effect transistor (FET), the first plural contacts comprise first source and drain contacts and the second plural contacts comprise second source and drain contacts, the p+Si substrate comprises a gate of the FET, and the graphene layer comprises a channel layer of the FET.

10. The semiconductor device of claim 1, wherein the dielectric layer comprises an oxide layer and the first plural contacts are formed in the oxide layer, such that the upper surface of the first plural contacts is substantially co-planar with an upper surface of the oxide layer, and the graphene layer is formed on the upper surface of the first plural contacts and the upper surface of the oxide layer.

11. The semiconductor device of claim 1, wherein a width of the first plural contacts is substantially equal to a width of the second plural contacts, such that an innermost edge of the first plural contacts is aligned with an innermost edge of the second plural contacts, and an outermost edge of the first plural contacts is aligned with an outermost edge of the second plural contacts.

12. The semiconductor device of claim 11, wherein the width of the first plural contacts is in a range from 20 nm to 1000 nm.

13. The semiconductor device of claim 1, wherein a thickness of the first plural contacts is in a range from 20 nm to 300 nm.

14. A semiconductor device, comprising:
    a semiconductor substrate;
    a dielectric layer comprising a pair of trenches;
    first source and drain contacts formed in the pair of trenches of the such that the dielectric layer comprises:
        a first portion which is formed between the first source and drain contacts; and a second portion which is formed between the semiconductor substrate and the first source and drain contacts;

a graphene layer formed on the first portion of the dielectric layer and on the first source and drain contacts, an upper surface of the first source and drain contacts being substantially co-planar with an upper surface of the first portion of the dielectric layer, and the graphene layer being formed on the upper surface of the first source and drain contacts and the upper surface of the first portion of the dielectric layer, and a difference in height between the upper surface of the first source and drain contacts and a height of the upper surface of the first portion of the dielectric layer being no greater than 5 nm, such that the graphene layer comprises an undistorted graphene layer; and second source and drain contacts formed on the graphene layer such that the graphene layer is formed between the first source and drain contacts and the second source and drain contacts, an area of the first source and drain contacts being substantially the same as an area of the second source and drain contacts, and the first source and drain contacts being substantially aligned with the second source and drain contacts to form a double-contact configuration.

15. A graphene field effect transistor (FET), comprising:

a back gate comprising a doped semiconductor substrate;

a gate dielectric comprising a dielectric layer formed on the doped semiconductor substrate;

first source and drain contacts embedded in the dielectric layer such that the dielectric layer comprises:
   a first portion which is formed between the first source and drain contacts; and
   a second portion which is formed between the doped semiconductor substrate and the first source and drain contacts;

a channel layer comprising a graphene layer formed on a surface of the first portion of the dielectric layer and on a surface of the first source and drain contacts; and second source and drain contacts formed on the graphene layer such that the graphene layer is formed between the first source and drain contacts and the second source and drain contacts, wherein an area of contact of the first source and drain contacts is substantially the same as an area of contact of the second source and drain contacts, and the first source and drain contacts are substantially aligned with the second source and drain contacts to form a double-contact configuration, and wherein the surface of the first source and drain contacts is substantially co-planar with the surface of the first portion of the dielectric layer, such that the graphene layer comprises an undistorted graphene layer.

16. A method of forming a semiconductor device, comprising:

forming a dielectric layer in a semiconductor substrate;

forming first plural contacts in the dielectric layer such that the dielectric layer comprises:
   a first portion which is formed between the first plural contacts; and
   a second portion which is formed between the semiconductor substrate and the first plural contacts;

forming a graphene layer on an upper surface of the first portion of the dielectric layer and on an upper surface of the first plural contacts; and forming second plural contacts on the graphene layer such that the graphene layer is formed between the first plural contacts and the second plural contacts, wherein an area of contact of the first plural contacts is substantially the same as an area of contact of the second plural contacts, and the first plural contacts are substantially aligned with the second plural contacts to form a double-contact configuration, and wherein the upper surface of the first plural contacts is substantially co-planar with the upper surface of the first portion of the dielectric layer, such that the graphene layer comprises an undistorted graphene layer.

17. The method of claim 16, wherein the forming of the first plural contacts comprises:
   etching the substrate to form a pair of trenches;
   forming a titanium layer in the pair of trenches; and
   forming a palladium layer formed on the titanium layer in the pair of trenches.

18. The method of claim 16, wherein the forming of the graphene layer comprises one of:
   growing single-layer graphene by chemical vapor deposition (CVD) on a copper foil, transferring the grown single-layer graphene onto the first portion of the dielectric layer and the first plural contacts, and patterning the single-layer graphene; and
   mechanically exfoliating bilayer graphene from graphite flakes.

19. The method of claim 16, wherein the forming of the second plural contacts comprises:
   forming a titanium layer on the graphene layer;
   forming a palladium layer on the titanium layer; and
   forming a gold layer formed on the palladium layer.

20. The method of claim 16, wherein the forming of the second plural contacts comprises forming the second plural contacts such that an offset of a contact of the second plural contacts from a contact of the first plural contacts is not greater than 20 nm.

21. The method of claim 16, wherein the semiconductor substrate comprises a p+Si substrate, and a layer of $SiO_2$ formed on the p+Si substrate, and the forming of the first source and drain contacts comprises embedding the first and second drain contacts in the layer of $SiO_2$.

22. The method of claim 21, wherein the semiconductor device comprises a field effect transistor (FET), the first plural contacts comprise first source and drain contacts and the second plural contacts comprise second source and drain contacts, the p+Si substrate comprises a gate of the FET, and the forming of the graphene layer comprises forming a channel layer of the FET.

23. A method of forming a semiconductor device, comprising:

forming a dielectric layer in a semiconductor substrate;

forming first source and drain contacts in the dielectric layer such that:
   the dielectric layer comprises a first portion which is formed between the first source and drain contacts, and a second portion which is formed between the semiconductor substrate and the first source and drain contacts; and
   an upper surface of the first source and drain contacts is substantially co-planar with an upper surface of the first portion of the dielectric layer; and a difference in height between the upper surface of the first source and drain contacts and a height of the upper surface of the first portion of the dielectric layer is no greater than 5 nm;

forming a graphene layer on the upper surface of the first source and drain contacts and the upper surface of the first portion of the dielectric layer such that the graphene layer comprises an undistorted graphene layer; and forming second source and drain contacts on the graphene layer such that the graphene layer is formed between the first source and drain contacts and the second source and drain contacts in a double-contact configuration, an area of the first source and drain contacts being substantially the same as an area of the second source and drain contacts, and the first source and drain contacts being substantially aligned with the second source and drain contacts.

\* \* \* \* \*